United States Patent

Hirose

[11] Patent Number: 6,117,709
[45] Date of Patent: Sep. 12, 2000

[54] RESIN SEALING TYPE SEMICONDUCTOR DEVICE AND METHOD OF MANUFACTURING THE SAME

[75] Inventor: Shinichi Hirose, Okazaki, Japan

[73] Assignee: Denso Corporation, Kariya, Japan

[21] Appl. No.: 09/166,900

[22] Filed: Oct. 6, 1998

[30] Foreign Application Priority Data

Nov. 12, 1997 [JP] Japan ..................................... 9-310404

[51] Int. Cl.⁷ ........................... H01L 21/56; H01L 21/58; H01L 21/60

[52] U.S. Cl. ........................ 438/121; 438/122; 438/123; 438/124

[58] Field of Search .................... 438/121, 122, 438/123, 124, 125; 257/675

[56] References Cited

U.S. PATENT DOCUMENTS

| | | | |
|---|---|---|---|
| 4,331,831 | 5/1982 | Ingram et al. | 174/52 |
| 5,091,341 | 2/1992 | Asada et al. | 437/212 |
| 5,126,813 | 6/1992 | Takahashi et al. | 357/26 |
| 5,244,838 | 9/1993 | Casati et al. | 438/122 |
| 5,338,971 | 8/1994 | Casati et al. | . |
| 5,763,296 | 6/1998 | Casati et al. | . |
| 5,808,359 | 9/1998 | Muto et al. | 257/712 |
| 5,852,324 | 12/1998 | Poinelli et al. | 257/675 |
| 5,869,355 | 2/1999 | Fukaya | 438/123 |

FOREIGN PATENT DOCUMENTS

| | | |
|---|---|---|
| 54-18280 | 2/1979 | Japan . |
| 55-56649 | 4/1980 | Japan . |
| 58-173248 | 11/1983 | Japan . |
| 63-89259 | 6/1988 | Japan . |
| 2-29539 | 2/1990 | Japan . |
| 6-252315 | 9/1994 | Japan . |

*Primary Examiner*—Mary Wilczewski
*Assistant Examiner*—David J. Goodwin
*Attorney, Agent, or Firm*—Pillsbury Madison & Sutro Intellectual Property Group LLP

[57] ABSTRACT

A heat sink with first and second sides are connected to a lead frame. The lead frame has a first group of inner leads having front end portions arranged to make a specific interval with the first side of the heat sink on a horizontal plane and a second group of inner leads having front end portions arranged to make a specific interval with the second side of the heat sink on the horizontal plane. In this stat, the first and second group of the inner leads are connected to a semiconductor chip mounted on the heat sink through several wires. Accordingly, the inner leads and the semiconductor chip can be connected without causing short-circuit between the inner leads and the heat sink.

13 Claims, 6 Drawing Sheets

RESIN SEALING TYPE SEMICONDUCTOR DEVICE AND METHOD OF MANUFACTURING THE SAME

CROSS REFERENCE TO RELATED APPLICATION

This application is based upon and claims the benefit of priority of the prior Japanese Patent Application No. 9-310404, filed on Nov. 12, 1997, the contents of which are incorporated herein by reference.

BACKGROUND OF THE INVENTION

1. Field of the Invention

This invention relates to a resin sealing type semiconductor device including a resin mold package encapsulating a semiconductor chip, which is mounted on a heat sink and is electrically connected to inner leads extended from a lead frame to define a specific gap with the heat sink through wires.

2. Description of the Related Art

A semiconductor device for power such as a power IC or a driver IC used for an automotive engine control ECU or an automotive ECU for ABS generally includes a semiconductor chip holding a power MOSFET. JP-A-54-18280 and JP-A-6-252315 disclose such kind of a semiconductor device, and the semiconductor device adopts a package holding a heat sink for facilitating heat radiation from the semiconductor chip.

As shown in FIGS. 6, 7, the semiconductor device including the heat sink is conventionally formed using a lead frame. FIG. 6 partially shows the semiconductor device at a step before it is molded into a resin mold package, and FIG. 7 shows a cross-sectional structure of the semiconductor device along a VII—VII line in FIG. 6. In FIGS. 6, 7, after a semiconductor chip 1 is attached (die-bonded) to a heat sink 2 by die-bonding, a pair of opposed sides (only one side is shown) of the heat sink 2 is connected to connection parts 3a protruding from a lead frame 3 by caulking. The lead frame 3 has several inner leads 3b, 3c on both opposed sides thereof. The inner leads 3b, 3c are arranged in two lines so that the front end faces thereof face the both opposed sides of the heat sink 2 with a specific interval therebetween.

The front end faces of the inner leads 3b, 3c are connected to the semiconductor chip 1 through bonding wires 4 by a wire bonding step. In the wire bonding step, as shown in FIG. 8, a wire bonding jig for supporting the heat sink 2 and the inner leads 3b, 3c on the lower side thereof is used. In the conventional structure, because the wire bonding jig 5 is used, the inner leads 3b, 3c are not overlapped with the heat sink 2, and the front end faces of the inner leads 3b, 3c are respectively arranged in a line. Accordingly, there arise a possibility that the lengths of some of the bonding wires 4 exceeds a critical length to connect the front end faces of the inner leads 3b, 3c and the semiconductor chip 1.

To solve the problem, as shown in FIGS. 9, 10, a lead frame structure in which the heat sink and the inner leads are overlapped with one another is proposed. In FIGS. 9, 10, a heat sink 2a to which a semiconductor chip 1 is bonded is connected to a lead frame 6 by caulking. The lead frame 6 has several inner leads 6b, 6c, which are overlapped with the heat sink 2a, i.e, disposed above the heat sink 2a. Some of the inner leads 6b, 6c are perpendicularly bent. Accordingly, the front end faces of the inner leads 6b, 6c face the respective four side faces of the semiconductor chip 1a with specific intervals therebetween. In this case, the inner leads 6b, 6c and the semiconductor chip 1a can be connected to one another through the bonding wires 4 having desirable lengths.

In such a lead frame structure, however, the inner leads 6b, 6c are readily deformed in the wire bonding step. This may cause short-circuit between the inner leads 6a, 6b and the heat sink 2a. To solve this problem, for example as shown in FIG. 11, a metallic jig 7 can be inserted into gaps between the inner leads 6b, 6c and the heat sink 2a in the wire bonding step. However, this complicates the wire bonding step. Even if the wire bonding is stably performed without causing the short-circuit, in a molding step which is performed after that, the inner leads 6b, 6c may be deformed due to an injection pressure for mold resin, so that the short-circuit between the inner leads 6b, 6c and the heat sink 2a can occur.

SUMMARY OF THE INVENTION

The present invention has been made based on the above problems. An object of the present invention is to provide a resin sealing type semiconductor device capable of preventing short-circuit between inner leads and a heat sink, and securely providing connection between the inner leads and a semiconductor chip mounted on the heat sink using wires with desirable lengths. Another object of the present invention is to provide a method of manufacturing the resin sealing type semiconductor device described above.

Briefly, a resin sealing type semiconductor device according to the present invention has a heat sink with a first side, a second side generally perpendicular to the first side, and an arm portion elongated from the second side, and a semiconductor chip mounted on the heat sink. A first group of inner leads are arranged such that respective front end portions face the first side of the heat sink with a specific interval on a plane parallel to a heat sink surface, and a second group of inner leads are arranged such that respective front end portions face the second side of the heat sink with a specific interval on the plane. The first and second groups of the inner leads are connected to the semiconductor chip through a plurality of wires.

Accordingly, when the first and second groups of the inner leads are connected to the semiconductor chip, the inner leads can be securely supported by a jig and the like. The inner leads are hardly deformed, so that short-circuit between the inner leads and the heat sink is prevented. In addition, the wires can have desirable lengths.

Preferably, the first and second groups of the inner leads respectively have base portions, which are arranged in a line. The second groups of the inner leads are bent to elongate along the arm portion of the heat sink and to face the second side of the heat sink.

In a method for manufacturing a resin sealing type semiconductor device according to the present invention, after a heat sink having a first side, a second side generally perpendicular to the first side, and an arm portion elongated from the second side is formed, a lead frame having a first group of inner leads and a second group of inner leads is formed. The first group of the inner leads has a first group of front end portions arranged in a first line, and the second group of the inner leads has a second group of front end portions arranged in a second line perpendicular to the first line. Then, the arm portion of the heat sink is connected to the lead frame such that the first group of the front end portions makes a first interval with the first side of the heat sink on a plane parallel to a heat sink surface and the second group of the front end portions makes a second interval with the second side of the heat sink on the plane. Then, after a semiconductor chip is bonded onto the heat sink, front surfaces of the first and second groups of the inner leads are connected to the semiconductor chip through a plurality of wires, while supporting back surfaces of the first and second groups of the inner leads on an opposite side of the front surfaces at least at regions corresponding to regions to which the plurality of wires are connected. Accordingly, the inner leads and the semiconductor chip can be securely and readily connected.

BRIEF DESCRIPTION OF THE DRAWINGS

Other objects and features of the present invention will become more readily apparent from a better understanding of the preferred embodiments described below with reference to the following drawings.

DETAILED DESCRIPTION OF THE PREFERRED EMBODIMENTS

Figure 1:
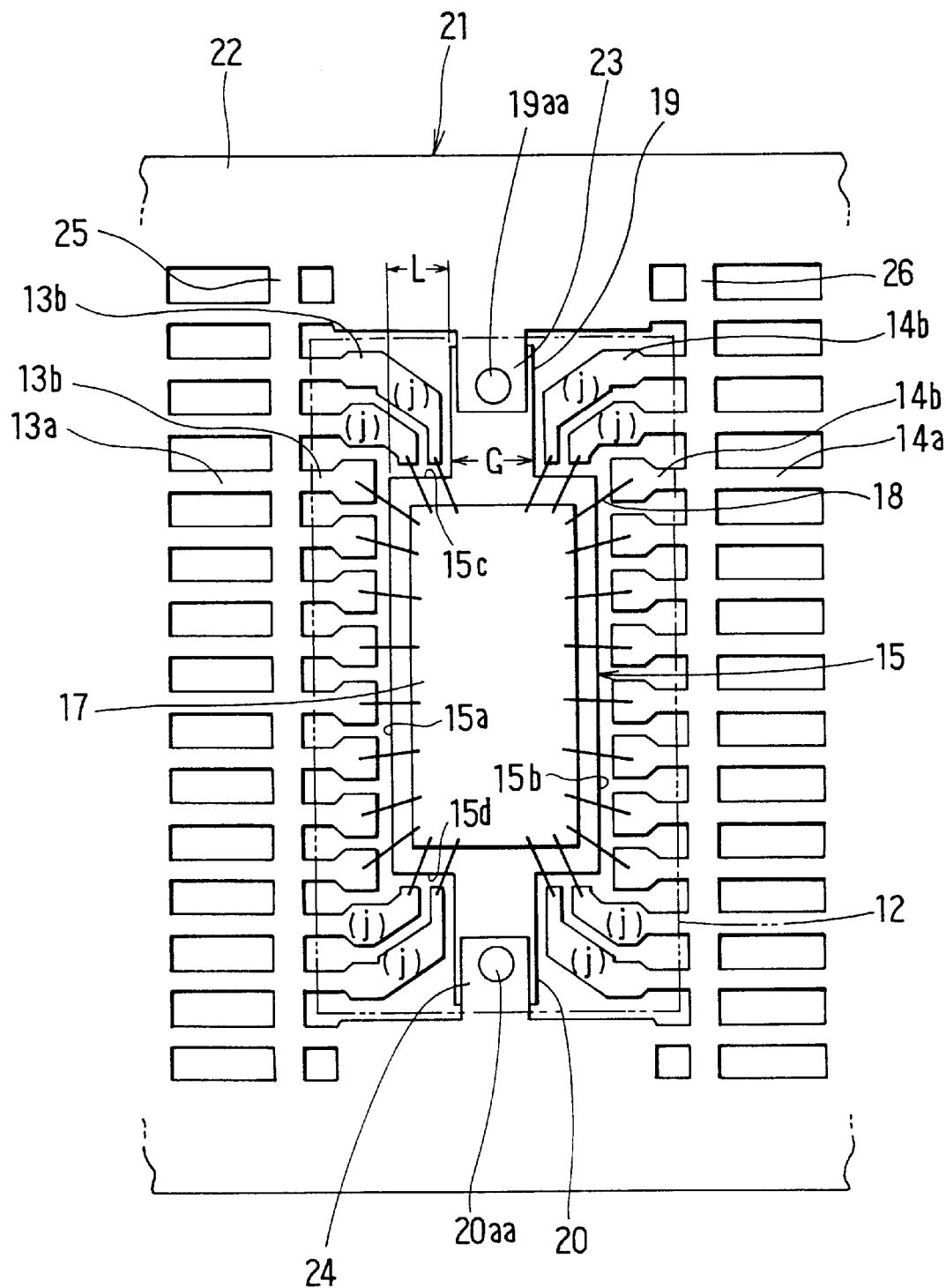
FIG. 1 is a plan view showing a resin sealing type semiconductor device on the way of manufacturing it, in a preferred embodiment.

A preferred embodiment of the present invention will be explained with reference to FIGS. 1–5. Referring to FIG. 2, a resin sealing type semiconductor device 11 is SOP type of for example 24-pin, having a resin mold package 12 and several Gullwing-shaped leads 13, 14 respectively (for example 12 leads) protruding from respective two opposed side faces of the package 12. A heat sink 15 and a semiconductor chip 17 die-bonded to the upper surface of the heat sink 15 by bonding material 16 are accommodated in the resin mold package 12. The semiconductor chip 17 is connected to the lead wires 13, 14 through bonding wires 18. As the bonding material 16, material such as silver (Ag) paste or solder having sufficient heat transfer property can be used. The lower surface of the heat sink 15 is exposed from the resin mold package 12.

Figure 2:
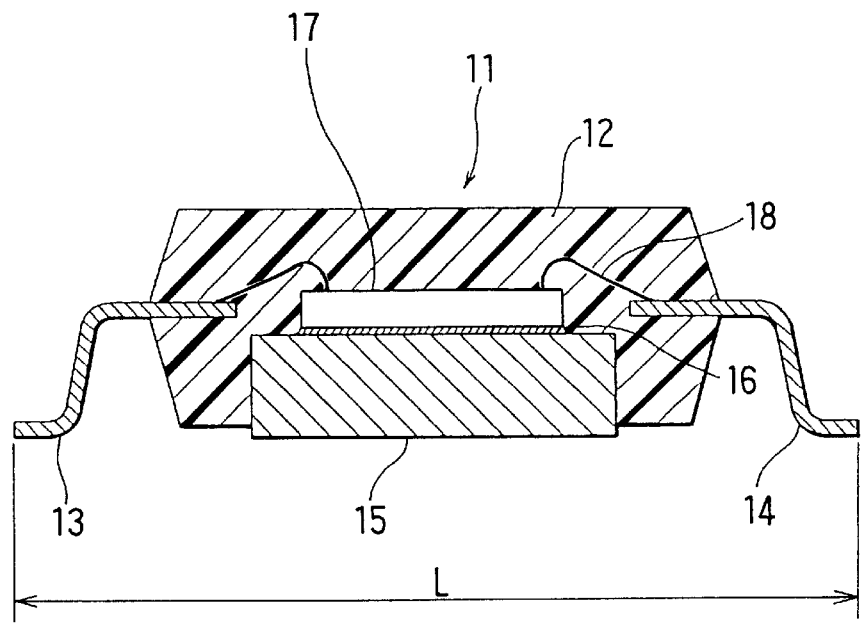
FIG. 2 is a cross-sectional view showing the resin sealing type semiconductor device in a completed state.

FIG. 1 shows the semiconductor device 11 on the way of manufacture. The heat sink 15 is formed from heat transfer metal such as copper or aluminum into a rectangular plate like shape. One of a pair of long side portions 15a, 15b of the heat sink 15 corresponds to a first side in the present invention and one of a pair of short side portions 15c, 15d perpendicularly crossing the long side portions 15a, 15b correspond to a second side in the present invention. The heat sink 15 is integrally formed with arm portions 19, 20 elongated from parts (central portions) of the short sides 15c, 15d, respectively.

A lead frame 21 has a frame body 22 to which the heat sink 15 is connected. The frame body 22 is integrally formed with a pair of connection parts 23, 24, which are connected to the arm portions 19, 20 of the heat sink 15 by caulking and tie-bars 25, 26 for supporting outer leads 13a, 14a and inner leads 13b, 14b, which are connected to the leads 13, 14.

The inner leads 13b, 14b includes several inner leads (a first group of inner leads in the present invention) straightly elongated in parallel relationship to each other from the frame body 22 toward the respective long side portions 15a, 15b of the heat sink 15 and terminated at respective base portions. As shown in FIG. 1, the base portions having greater widths than the parallel portions and to make a specific interval with the corresponding long side portions 15a, 15b on a horizontal face. The inner leads 13b, 14b further includes several inner leads (a second group of inner leads, indicated with (j) in FIG. 1), which are elongated from the frame body 22, are bent, and are further elongated along the arm portions 19, 20 toward the respective short side portions 15c, 15d. The second group of the inner leads also make a specific interval with the short side portions 15c, 15d, respectively, on the horizontal face. The inner leads 13b, 14b do not overlap with the heat sink 15 in this embodiment. Incidentally, in FIG. 1, the contour of the resin mold package 12 is indicated with two-dot chain line.

Next, a heat sink formation step and a connection step for connecting the heat sink 15 to the lead frame 21 are explained with reference to FIGS. 4, 5.

Figure 4A:
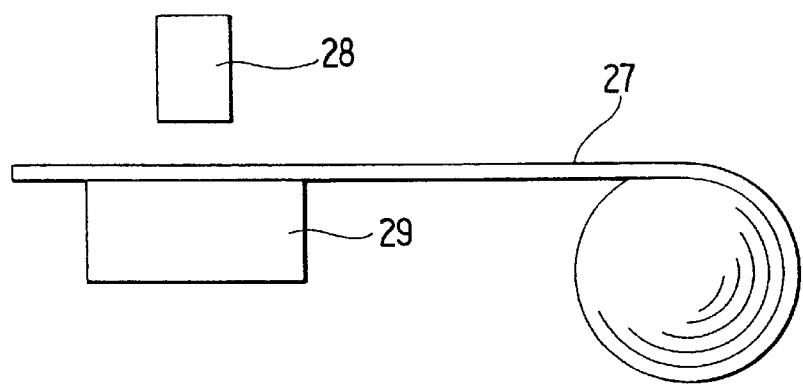
FIGS. 4A–4D are schematic views showing a formation step of the heat sink in a stepwise manner.
Figure 4B:
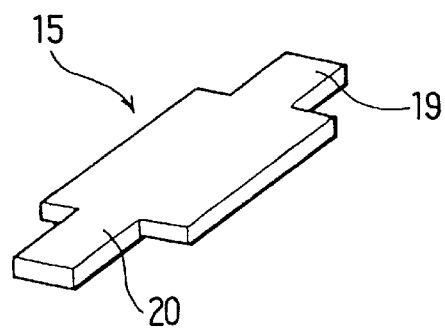
Figure 4C:
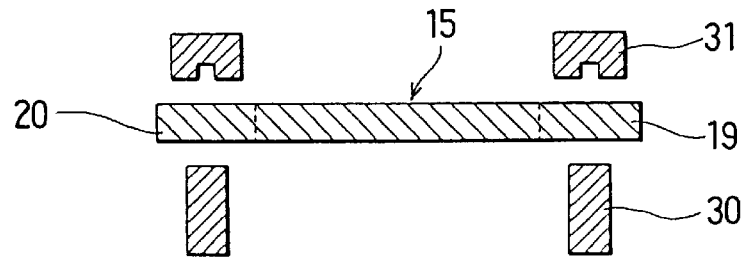
Figure 4D:
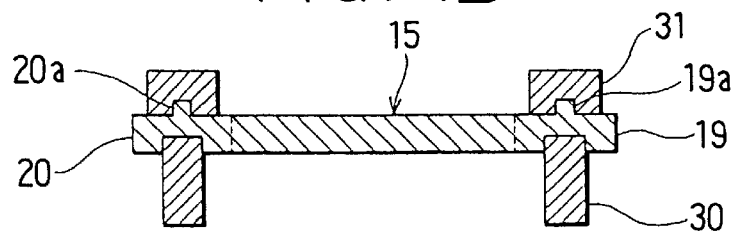

Referring to FIG. 4A, in the heat sink formation step, stamping is performed on a spooled plate-like heat sink material 27 using a punch 28 and a die 29. Accordingly, the heat sink 15 having a shape shown in FIG. 4B with the arm portions 19, 20 is stamped out. Next, as shown in FIGS. 4C, 4D, the front end parts of the arm portions 19, 20 are stamped using a punch 30 and a die 31 to have protrusions 19a, 20a for caulking.

After that, the connection step is carried out for connecting the heat sink 15 to the connection parts 23, 24 of the lead frame 23 which is formed through a lead frame formation step into the shape shown in FIG. 1. In the lead frame formation step, the lead frame 23 is formed by for example stamping, into the shape with the pair of the connection parts 23, 24, the lead frame body 22, the outer leads 13a, 14a, and the inner leads 13b, 14b. At the same time, through holes 23a, 24a are respectively formed in the connection parts 23a, 24a.

Figure 5A:
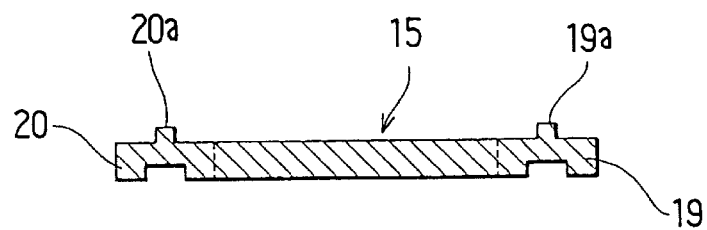
FIGS. 5A–5D are schematic views showing a connection step for connecting the heat sink and a lead frame in a stepwise manner.
Figure 5B:
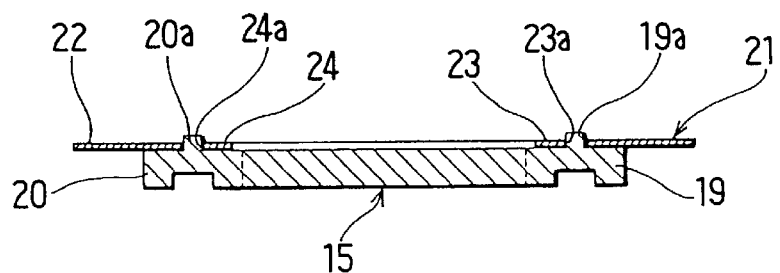
Figure 5C:
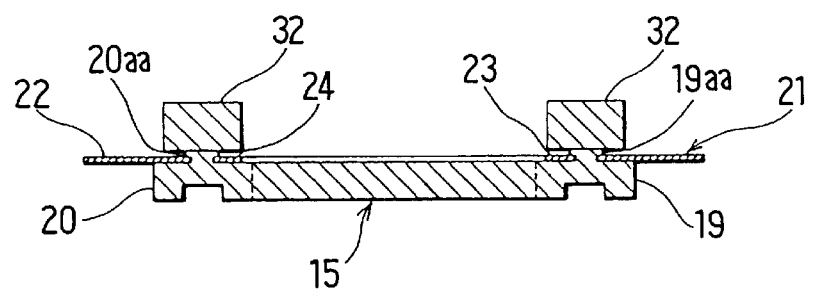
Figure 5D:
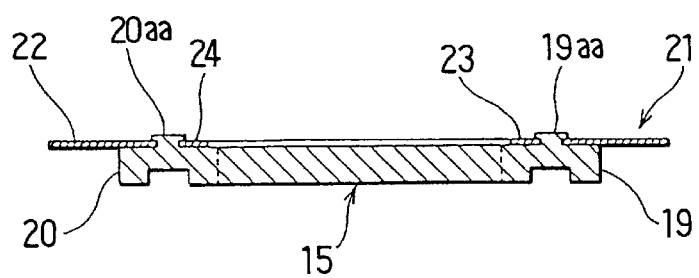
Figure 6:
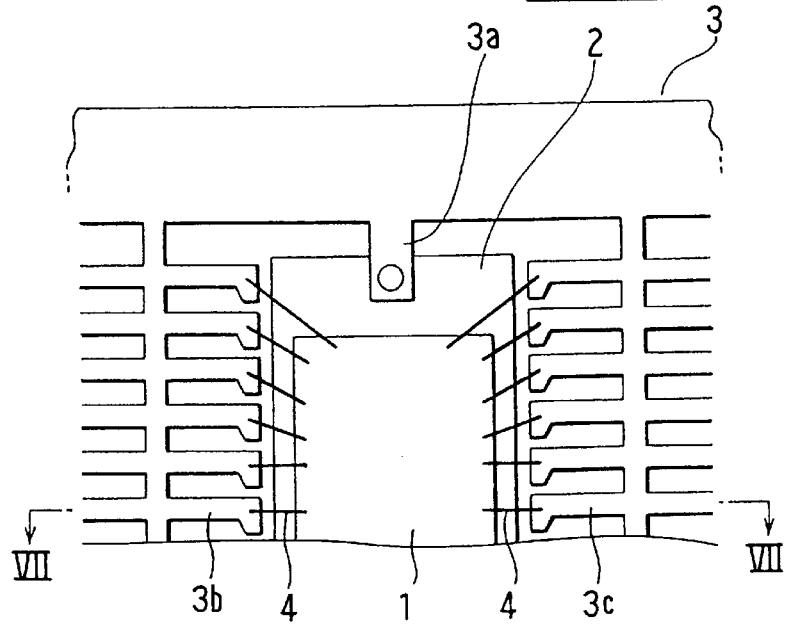
FIG. 6 is a plan view partially showing a resin sealing type semiconductor device on the way of manufacture in a prior art.
Figure 7:
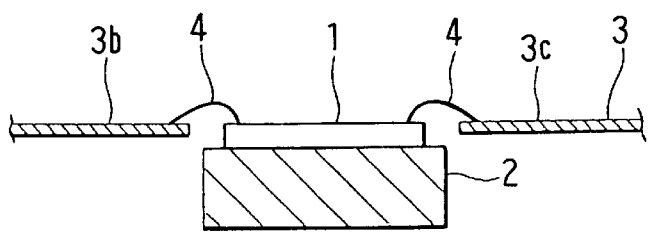
FIG. 7 is a cross-sectional view taken along a VII—VII line in FIG. 6.
Figure 8:
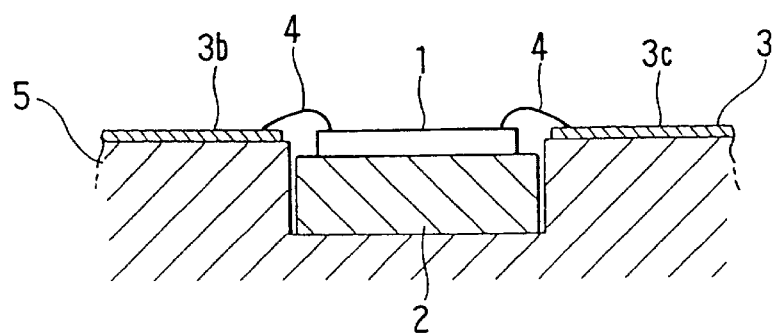
FIG. 8 is a cross-sectional view for explaining an arrangement of a wire bonding jig for manufacturing the semiconductor device in the prior art.
Figure 9:
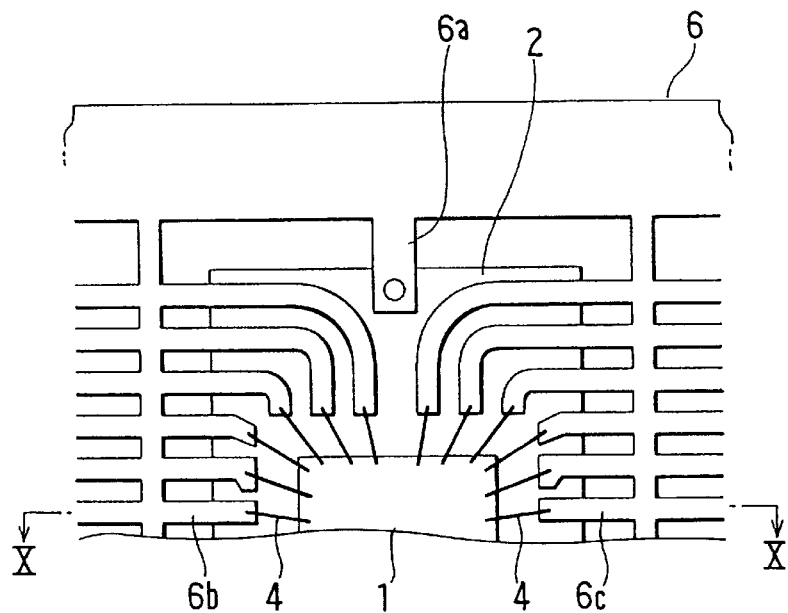
FIG. 9 is a plan view partially shownig a resin sealing type semiconductor device on the way of manufacture in another prior art.
Figure 10:
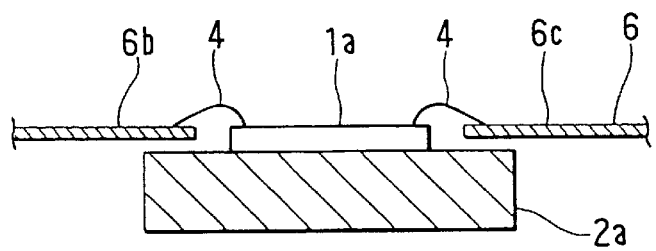
FIG. 10 is a cross-sectional view taken along a X—X line in FIG. 9.
Figure 11:
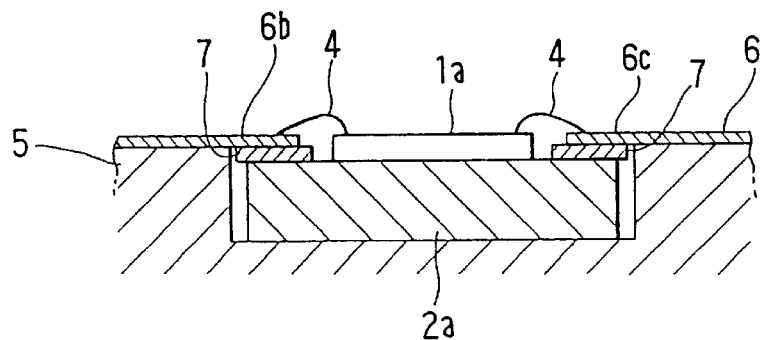
FIG. 11 is a cross-sectional view for explaining an arrangement of a wire bonding jig for manufacturing the semiconductor device of FIGS. 9, 10.

In the connection step, as shown in FIGS. 5A, 5B, the protrusions 19a, 20a for caulking on the heat sink side are inserted into the through holes 23a, 24a of the connection parts 23, 24 on the lead frame side. Next, as shown in FIG. 5C, in that state, the protrusions 19a, 20a are crushed by caulking using a punch 32. As a result, as shown in FIG. 5D, the heat sink 15 is connected to the lead frame 21. In FIG. 1, the protrusions crushed by caulking are indicated with reference numerals 19aa, 20aa, respectively.

After the connection step described above is finished, a die-bonding step, a wire connection step, a molding step, and a lead formation step, which are not specifically shown, are performed in that order. In the die-bonding step, the semiconductor chip 17 is mounted onto the heat sink 15. In the wire connection step, the semiconductor chip 17 is connected respective base portions of to the inner leads 13b, 14b through the bonding wires 18. At that time, the back face areas of the inner leads 13b, 14b are pushed (supported) by a jig and the like (supporting member) at areas corresponding to the surface areas to which the bonding wires 18 are connected. In the molding step, the resin mold package 12 is formed by molding to hold the semiconductor chip 17 and the heat sink 17 therein in the state that at least the back side face (the lower face) of the heat sink 15 is exposed outside. In the lead formation step, the lead frame 21 is cut at specific portions (positions for separating the connections parts 23, 24 along the outer side face of the resin mold package 12, and positions for removing the tie-bars 25, 26), and the outer leads 13a, 14a are formed into the Gullwing shape, respectively. Accordingly, the resin sealing type semiconductor device 11 shown in FIG. 2 is completed.

Figure 3:
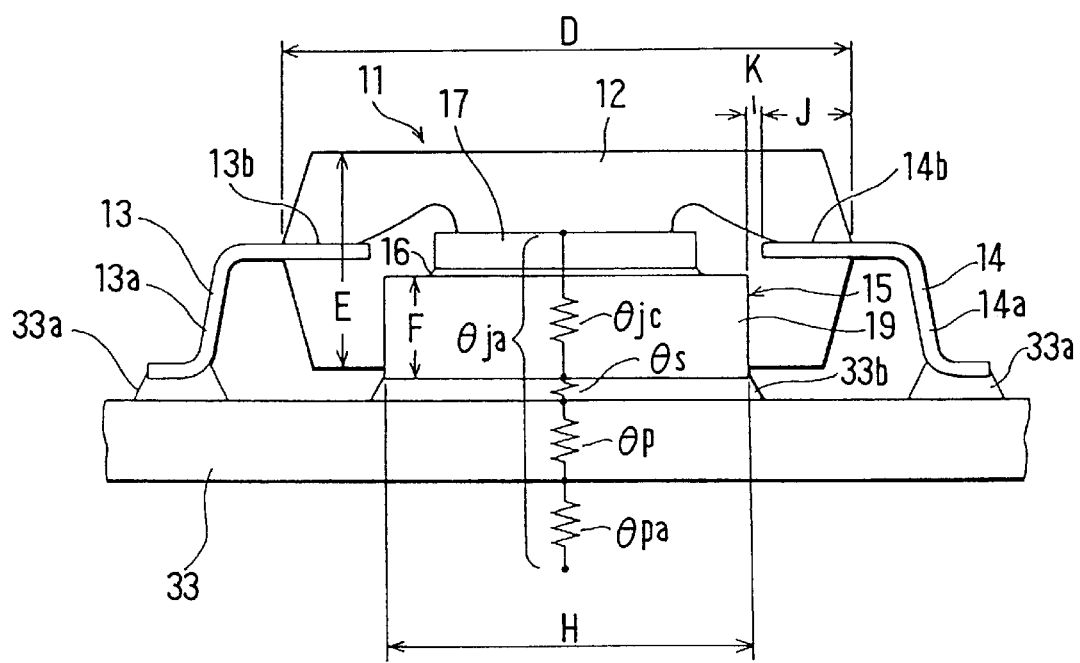
FIG. 3 is a schematic cross-sectional view for explaining a realtionship between heat radiation property of a heat sink and dimensions of the heat sink.

Referring to FIG. 3, the semiconductor device 11 is finally mounted on a printed circuit board 33. When it is mounted, the leads 13, 14 are connected to connection patters (not shown) on the printed circuit board 33 through solder 33a, and the exposed lower face of the heat sink 15 is bonded to lands (not shown) on the printed circuit board 33 through solder 33b while being accompanied by heat transfer.

Next, specific dimensions of the heat sink 15 are considered referring to FIGS. 1–3. In the SOP type package in the present embodiment, when a nominal size L is 375 mil, it is general that a package width D is approximately 7.5 mm and a package thickness E is approximately 2.5 mm. A pin pitch is approximately 1.27 mm. Because the lower face of the heat sink 15 is to be exposed from the resin mold package 12, a thickness F of the heat sink 15 is inevitably 1.25 mm, which is approximately a half of the package thickness E. A width G (see FIG. 1) of each of the arm portions 19, 20 of the heat sink 15 needs be equal to or larger than the thickness F of the heat sink 15, and is approximately 1.3 mm. This is because it is necessary that the arm portions 19, 20 are prevented from twisting and deforming when they are formed by stamping and that the arm portions 19, 20 have high shape repeatability.

Also, a width H of the heat sink is set as follows. Specifically, a pull-out strength of an inner lead, which has the shortest embedded dimension embedded in the resin mold package 12 of all the inner leads 13b, 14b, and a length (for securing moisture proof property) from a second bonding portion in the wire bonding step (the wire bonding portion on the inner leads 13b, 14b) to the outer surface of the package are considered. In this case, it is empirically appropriate that a distance J between the front end face of the inner lead having the shortest embedded dimension and the outer surface of the package is approximately 1 mm. In this case, referring again to FIG. 3, when a clearance K between the heat sink 15 and the inner leads 13b, 14b is 0.3 mm, the width H of the heat sink 15 has a value fixed by subtracting two times of summation of the distance J (=1 mm) and the clearance K (=0.3 mm) from the package width D (=7.5 mm). That is, $$H=7.5-(1+0.3)\times2=4.9 \text{ mm}$$

A width L (see FIG. 1) of the region where each of the inner leads 13b, 14b (indicated with (j) in FIG. 1) is bent to elongate in an elongating direction of the arm portions 19, 20 is a half of a value fixed by subtracting the width G (=1.3 mm) of the arm portions 19, 20 from the width H (=4.9 mm) of the heat sink 15. That is, $$L=(4.9-1.3)\div2=1.8 \text{ mm}$$

Therefore, as shown in FIG. 1, when the lead pitch (pin pitch) in the region is less than approximately 0.9 mm, the inner leads 13b, 14b indicated with (j) can be easily arranged.

Each length of the arm portions 19, 20 is determined in accordance with a number of the lead pins of the package (the sum of the leads 13, 14, which is 24 in this embodiment), i.e., in accordance with the length of the resin mold package 12 and the chip size of the semiconductor chip 17. In the packages having the same number of the lead pins, the length of the respective arm portions 19, 20 is increased as the chip size is decreased. Thus, the length of the arm portions 19, 20 are controlled so that it can correspond semiconductor chip with various chip sizes. As a result, the semiconductor chip has high flexibility in chip size thereof.

Next, effects on the heat radiation property of the heat sink 15 when the dimensions of the heat sink 15 are set as described above are considered.

In the resin sealing type semiconductor device 11 in the present embodiment, the size of the heat sink 15 is reduced as compared to the conventional structures shown in FIGS. 6–11. When the heat sink 15 in the present embodiment is compared to the conventional heat sink shown in FIGS. 9–11, the heat sink 15 is miniaturized not to overlap with the inner leads 13b, 14b. When the heat sink 15 is compared to another conventional heat sink shown in FIGS. 6–8, the heat sink 15 is miniaturized by the dimension corresponding to the spaces where some of the inner leads 13b, 14b are arranged to face the respective short side portions 15c, 15d. However, the decrease in heat radiation property of the heat sink 15 due to the size reduction is insignificant as described below.

That is, referring again to FIG. 3, the heat sink 15 is soldered onto the lands on the printed circuit board 33. In this structure, thermal resistance θja (thermal resistance between a junction in the chip and atmosphere) is represented by the following formula (1);

$$\theta ja=\theta jc+\theta s+\theta p+\theta pa \qquad (1)$$

in which θjc is thermal resistance between the junction and the package, θs is thermal resistance at the soldering portion, θp is thermal resistance of the printed circuit board 33, and θpa is thermal resistance between the printed circuit board 33 and the atmosphere. When the size, material, number of layers, density of copper wiring patterns, and the like, of the printed circuit board 33 are set at the identical conditions, the thermal resistances θp and θpa have identical values, respectively, regardless of the package.

The thermal resistances θjc and θs are affected by the package. The thermal resistance θjc is very small, and is approximately 1° C./W–2° C./W. This is because the semiconductor chip 17 is directly die-bonded to the heat sink 15 through the bonding material 16 having high thermal conductivity, and accordingly heat developed from the semiconductor chip 17 is transmitted to the heat sink 15 having sufficient thermal conductivity through the bonding material 16. Because the thermal resistance θjc is naturally very small, especially in the case that the heat sink 15 is made of metal having sufficient thermal conductivity such as copper or aluminum, the thermal resistance θjc is hardly affected by the size of the heat sink 15. Likewise, the thermal resistance θs is basically small, because the solder 33b being the metal is used as the bonding material between the semiconductor chip 17 and the printed circuit board 33. Therefore, the thermal resistance θs is hardly affected by the connecting area between the semiconductor chip 17 and the printed circuit board 33.

That is, in the package structure in the present embodiment, when the heat sink 15 is soldered to the printed circuit board 33, even if the size of the heat sink 15 is reduced somewhat, the thermal resistance is not increased. As a result, the heat radiation property of the heat sink 15 does not deteriorate. In this embodiment, the above explanation is done using the heat sink 15 with the nominal size L of 375 mil as an example; however, the present invention can be applied to the other heat sinks having the other sizes, such as an 8-pin to 10-pin SOP with a nominal size L of 225 mil, a 10-pin to 16-pin SOI with a nominal size L of 300 mil, a 24-pin to 28-pin SOP with a nominal size L of 450 mil, and a 28–36 pins SOP with a nominal size L of 525 mil.

According to the present embodiment described above, the following effects can be provided.

In the resin sealing type semiconductor device 11, the front end portions of the inner leads 13b, 14b and the heat sink 15 do not overlap with one another. Accordingly, the wire bonding step for connecting the semiconductor chip 17 mounted on the heat sink 15 and the inner leads 13b, 14b, can be carried out while securely supporting the back faces of the inner leads 13b, 14b at the areas corresponding to the surface areas where the inner leads 13b, 14b are connected. As a result, the bonding reliability between the inner leads 13b, 14b and the bonding wires 18 are improved. The inner leads 13b, 14b are not readily deformed to make short-circuit with the heat sink 15 during the wire bonding step.

In the successive molding step, the inner leads 13b, 14b are hardly deformed due to injection pressure for the mold resin, so that the short-circuit between the inner leads 13b, 14b and the heat sink 15 is prevented. In addition, it is not necessary that a metallic jig is inserted into gaps between the heat sink and the inner leads as a conventional method, resulting in simplification of the wire bonding step.

Even when the size of the semiconductor chip is relatively small, the front end portions of the inner leads 13b, 14b can be arranged adjacently to the semiconductor chip 17. Therefore, the lengths of the bonding wires 18 for connecting the inner leads 13b, 14b and the semiconductor chip 17 are not limited, so that the semiconductor chip has high flexibility in size. As described above, the flexibility in size of the semiconductor chip is further increased by changing the lengths of the arm portions 19, 20. Consequently, the size of the semiconductor chip 17 can be optimized.

Further, in the present embodiment, the heat sink 15 and the frame body 22 are connected to one another by caulking the protrusions 19a, 20a of the heat sink 15, which are inserted into the through hole 23a, 24a of the frame body 22, respectively. Therefore, it is not necessary to use extra parts for the connection between the heat sink 15 and the frame body 22, resulting in low cost.

The resin sealing type semiconductor device 11 is manufactured by carrying out the ordinal die-bonding step, wire bonding step, molding step, and lead formation step in that general order, after the heat sink formation step, the lead formation step, and the connection step are carried out as described above. Therefore, the manufacturing process is not complicated.

In the present embodiment, the heat sink 15 exposed from the lower face of the resin mold package 12 is soldered to the lands on the printed circuit board 33; however, when the required heat radiation property of the heat sink 15 is low, the heat sink may be exposed from the upper surface of the resin mold package. The present embodiment is not limited to the SOP, which is a surface mounted type package, and may be applied to a pin insertion type package such as dual in-line package (DIP).

The shape of the heat sink 15 is not limited to a rectangular shape, and may be a circular shape or these similar shapes. The heat sink 15 and the connection portions 23a, 24 of the frame body 22 can be connected by the other methods such as welding or soldering, instead of by caulking using the protrusions 19a, 20a and the through holes 23a, 24a. Although the heat sink 15 has the pair of arm portions 19, 20 on both sides to be supported by the lead frame 21, the heat sink 15 can be supported by the lead frame 21 only at one side.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of manufacturing a resin sealing-type semiconductor device, comprising:
   providing a heat sink comp rising a first side, a second side generally perpendicular to the first side, and an arm portion extending from the second side;
   providing a lead frame having a first group of inner leads with a first group of front end portions and a second group of inner leads with a second group of front end portions;
   connecting the arm portion to the lead frame so that the first group of the front end portions and the second group of the front end portions are arranged so as to be parallel with the first side and the second side, respectively, yet are arranged so as not to overlap the front end portions of the first and second groups with the heat sink;
   bonding a semiconductor chip onto the heat sink; and
   connecting the inner leads of the first and second groups to the semiconductor chip with a plurality of respective wires.

2. The method of claim 1, wherein the first and second groups of inner leads have respective base portions arranged along a line, and further wherein the second group of inner leads are bent perpendicularly to form the second group of front end portions.

3. The method of claim 1, wherein said connecting of the inner leads of the first and second groups to the semiconductor chip comprises:
   connecting the wires to base portions of respective ones of the inner leads; and
   as any one front surface of the base portions of the inner leads is being connected to a respective one of the wires, supporting a surface opposite to the front surface with a supporting member.

4. The method of claim 1, wherein the heat sink is rectangular, wherein the arm portion is a first arm portion extending from the second side of the heat sink, and further wherein the heat sink comprises a second arm portion extending from a side of the heat sink which is opposite to and parallel with the second side.

5. The method of claim 1, wherein said connecting of the arm portion to the lead frame comprises caulking the arm portion to the lead frame.

6. The method of claim 1, wherein:

the first group of inner leads have first parallel portions extending from the lead frame in parallel relationship to each other and terminating at respective first base portions having greater widths than the first parallel portions, said first base portions being aligned with each other in parallel to a first side of the lead frame; and the second group of inner leads have second parallel portions extending from the lead frame in parallel relationship to each other and terminating at respective second base portions having greater widths than the second parallel portions, said second base portions being aligned with each other in parallel to a second side of the lead frame.

7. The method of claim 6, wherein the first base portions are arranged at an equal pitch to each other and wherein the second base portions are arranged at an equal pitch to each other.

8. The method of claim 6, further comprising forming a resin mold package encasing the semiconductor chip, wherein the first base portions are arranged equidistant from a first edge of the resin mold package, and wherein the second base portions are arranged equidistant from a second edge of the resin mold package.

9. The method of claim 8, wherein the first base portions are arranged at an equal pitch to each other and wherein the second base portions are arranged at an equal pitch to each other.

10. The method of claim 1, wherein the first group of inner leads and the second group of inner leads have respective exposed portions protruding from a side of the lead frame and arranged parallel to each other.

11. A method of manufacturing a resin sealing-type semiconductor device, comprising:

providing a heat sink comprising a first side and a second side perpendicular to the first side;

providing a lead frame having a side and a plurality of inner leads extending from the side;

connecting the lead frame to the heat sink so that a first group of the inner leads are arranged in facing and spaced relationships to the first side of the heat sink and a second group of the inner leads are arranged in facing and spaced relationships to the second side of the heat sink, the inner leads of the first group being spaced from the first side of the heat sink by a first gap and the inner leads of the second group being spaced from the second side of the heat sink by a second gap;

bonding a semiconductor chip onto the heat sink; and connecting the inner leads of the first and second groups to the semiconductor chip with a plurality of respective wires.

12. The method of claim 11, wherein:

the first group of inner leads have first parallel portions extending from the lead frame in parallel relationship to each other and terminating at respective first base portions having greater widths than the first parallel portions, said first base portions being aligned with each other and having ends arranged parallel to a first side of the lead frame; and the second group of inner leads have second parallel portions extending from the lead frame in parallel relationship to each other and terminating at respective second base portions having greater widths than the second parallel portions, said second base portions being aligned with each other and having ends arranged parallel to a second side of the lead frame.

13. The method of claim 11, wherein the inner leads of the first group and the second group do not overlap with the heat sink.

* * * * *